United States Patent
Jian et al.

(10) Patent No.: US 7,609,122 B2
(45) Date of Patent: Oct. 27, 2009

(54) METHOD AND SYSTEM FOR CALIBRATION OF A TANK CIRCUIT IN A PHASE LOCK LOOP

(75) Inventors: Heng-Yu Jian, Los Angeles, CA (US); Zhiwei Xu, Los Angeles, CA (US); Yi-Cheng Wu, Los Angeles, CA (US); Charles Chien, Newbury Park, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 69 days.

(21) Appl. No.: 11/868,306

(22) Filed: Oct. 5, 2007

(65) Prior Publication Data

US 2009/0091396 A1    Apr. 9, 2009

(51) Int. Cl.
*H03B 5/08*    (2006.01)
(52) U.S. Cl. .............. 331/179; 331/44; 331/36 C; 331/167
(58) Field of Classification Search ............ 331/16, 331/36 C, 34, 44, 117 R, 117 FE, 167, 177 V, 331/179; 327/156, 157
See application file for complete search history.

(56) References Cited

U.S. PATENT DOCUMENTS

| | | | | |
|---|---|---|---|---|
| 7,382,199 B2 * | 6/2008 | Talwalkar | ............ | 331/16 |
| 2003/0206065 A1 * | 11/2003 | Gomez | ............ | 331/16 |
| 2006/0145769 A1 * | 7/2006 | Vaananen et al. | ............ | 331/16 |
| 2006/0226916 A1 * | 10/2006 | Florescu et al. | ............ | 331/16 |

* cited by examiner

*Primary Examiner*—Robert Pascal
*Assistant Examiner*—Ryan J. Johnson
(74) *Attorney, Agent, or Firm*—DLA Piper LLP (US)

(57) ABSTRACT

A phase lock loop (PLL) includes a calibration loop for calibrating a tank circuit for capacitance variation through process variations of manufacturing an integrated circuit including the PLL. A capacitance profile for setting the frequency of the PLL at a process corner is stored. At power up, or after an idle time, a calibration is performed at two frequencies. The capacitances of operating the phase lock loop at the two frequencies are determined and stored. During a frequency change, the capacitance of operating the PLL is determined from the capacitance profile and stored capacitances. The capacitance of the PLL is presumed to change linearly with frequency and the two stored capacitances are used to determine a difference capacitance at the selected frequency by linear interpolating between the two stored capacitances, which is added to the capacitance in the capacitance profile at the selected frequency to generate an operating capacitance.

16 Claims, 3 Drawing Sheets

METHOD AND SYSTEM FOR CALIBRATION OF A TANK CIRCUIT IN A PHASE LOCK LOOP

TECHNICAL FIELD

This application relates to phase lock loops, and more particularly to phase lock loops with calibration of tank circuits.

BACKGROUND

A semiconductor circuit includes a phase lock loop (PLL) having a voltage controlled oscillator (VCO) to generate a VCO frequency signal. However, process variations of the semiconductor circuit cause changes in the VCO frequency signal at different process corners. An adjustable capacitance circuit in a tank circuit may be used to control the VCO frequency. Because the capacitance varies with the desired VCO frequency, a VCO capacitance switch may be used. The frequency of the phase lock loop may be calibrated to control the VCO capacitance switch.

In one calibration scheme, the calibration of the frequency of the phase lock loop is performed each time a frequency is selected. A varactor control voltage is set to the voltage at one-half of the supply voltage. A digital frequency counter estimates the frequency while sweeping a full range of capacitors. The correct number of capacitors is determined for the estimated frequency closest to the desired frequency. This calibration scheme has a long settling time, and the calibration is done every time that the frequency is changed.

In another calibration scheme, the calibration of the frequency of the phase lock loop is performed for all frequencies after start up and the calibration values are stored in an on-chip static random access memory (SRAM). When the frequency is changed, the corresponding calibration value is read from the SRAM and used to set the capacitance of the tank circuit. This calibration scheme uses a large SRAM area on the semiconductor circuit and has a slow start-up.

SUMMARY

A method and system calibrate a phase lock loop. A capacitance profile of the phase lock loop for a frequency range at a first process corner is received. The first process corner may be a typical or nominal process corner of the phase lock loop. Capacitances for the phase lock loop to operate at a first frequency and a second frequency are determined. A first capacitance difference of the determined capacitance to operate the phase lock loop at a first frequency and a capacitance corresponding to the first frequency in the received capacitance profile is determined. A second capacitance difference of the determined capacitance to operate the phase lock loop at a second frequency and a capacitance corresponding to the second frequency in the capacitance frequency profile is determined. A difference capacitance corresponding to a selected operating frequency of the phase lock loop is calculated from the first and second difference capacitances. A capacitance for operating the phase lock loop at the selected operating frequency is determined in response to the capacitance corresponding to the received frequency profile at the selected frequency and the determined difference capacitance.

DETAILED DESCRIPTION

A phase lock loop includes a calibration loop for calibrating a tank circuit for capacitance variation through process variations of manufacturing an integrated circuit including the phase lock loop. At a first time, such as in the factory or laboratory, a first calibration of the phase lock loop is performed for a frequency range. A plurality of first capacitance values for setting a plurality of first frequencies in the frequency range is stored. In one aspect, the first capacitance values correspond to performance characteristics of the phase lock loop in a first configuration, such as nominal or typical process corners. At a second time, such as power up or after an idle time, a second calibration of the phase lock loop is performed. A plurality of second capacitance values for setting a plurality of second frequencies is stored. In one aspect, the plurality of second frequencies is two frequencies, such as frequencies near or at the ends of the frequency range. The second capacitance values correspond to performance characteristics of the phase lock loop in a second configuration, such as measured performance of the phase lock loop. A third capacitance value for setting a selected frequency is calculated using the pluralities of first and second capacitance values. In one aspect, the second capacitance values are used to set a linear frequency relationship for calculating a difference capacitance for a selected frequency that is to be added to the first capacitance value corresponding to the selected frequency.

Figure 1:
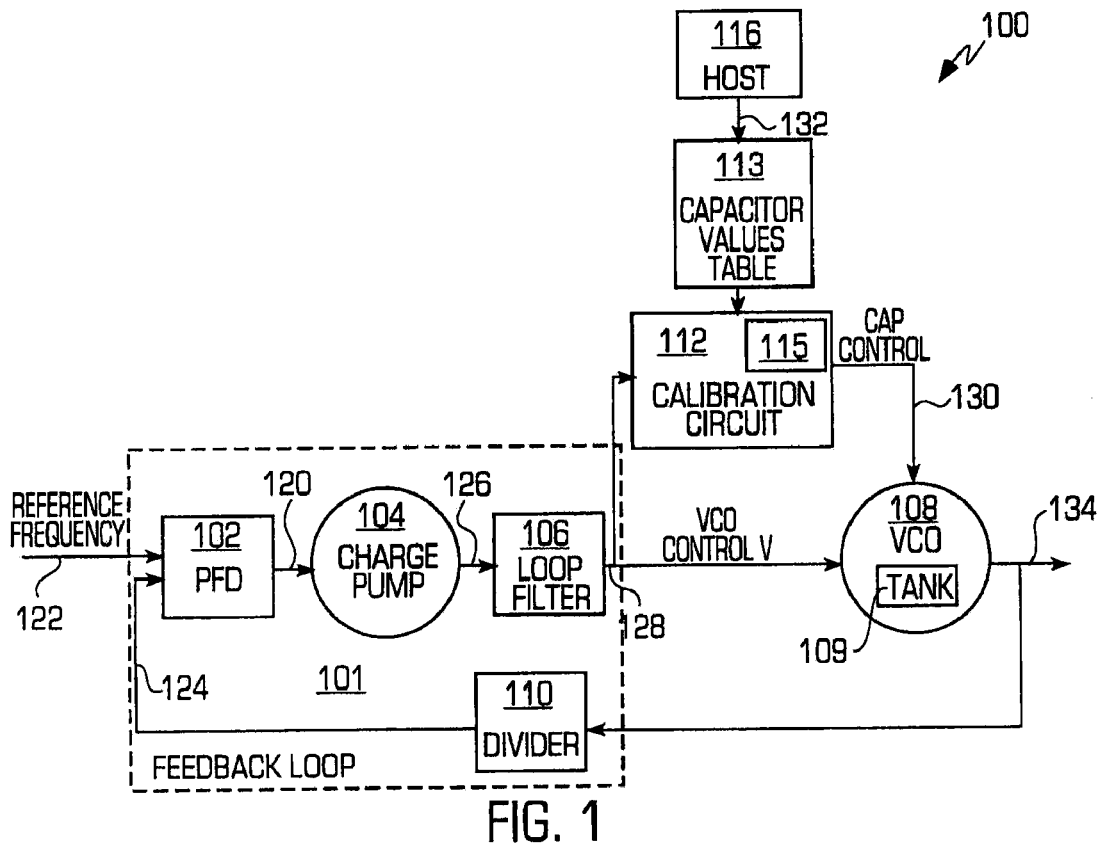
FIG. 1 is a block diagram illustrating a phase lock loop in accordance with aspects of the innovations herein.

FIG. 1 is a block diagram illustrating a phase lock loop 100. The phase lock loop 100 comprises a feedback loop 101 that includes a phase frequency detector (PFD) 102, a charge pump 104, a loop filter 106, and a divider 110. The divider 110 may be, for example, a fractional divider or an integer divider. The phase lock loop 100 further comprises a voltage controlled oscillator (VCO) 108, a calibration circuit 112, and a capacitor values table 113. The phase frequency detector 102 generates a phase frequency signal 120 in response to the difference in frequency and phase of a received reference frequency signal 122 and a divided frequency signal 124 from the divider 110. The charge pump 104 generates a boosted voltage signal 126 in response to the phase frequency signal 120. The loop filter 106 generates a VCO control voltage signal 128 in response to the boosted voltage 126, and provides the VCO control voltage 128 to the VCO 108 and the calibration circuit 112.

The VCO 108 comprises a tank circuit 109 for controlling the frequency of the voltage controlled oscillator 108. In one embodiment, the tank circuit 109 comprises an inductor-capacitor (LC) circuit. The capacitance of the tank circuit 109 is selectable in response to a capacitor control signal 130 from the calibration circuit 112. The capacitor control signal 130 is shown as a single signal line in FIG. 1, but may be multiple signal lines.

The capacitor values table 113 stores the control settings for setting a capacitance of the VCO 108. The capacitor values table 113 stores a capacitance profile comprising a capacitor value for each of a plurality of frequencies of the phase lock loop 100. In one embodiment, the capacitor values are received from an external source, such as a manufacturer or tester. In one embodiment, the capacitor values table 113 is external to the phase lock loop 100 and provides via an interface the capacitor values to the calibration circuit 112. The calibration circuit 112 receives capacitor values table data 132 from driver software or a host processor 116, which is external to the phase lock loop 100, e.g., during a manufacturing, testing or validation stage, which may be performed at the manufacturer or when the phase lock loop 100 is installed in a system, such as a communication system. The calibration circuit 112 generates the capacitor control signal 130 from the capacitor values stored in the capacitor values table 113 and the VCO control voltage signal 128. The calibration circuit 112 generates the capacitor control signal 130, from the VCO control voltage signal 128 and capacitor values stored in the capacitor values table 113. The calibration circuit 112 comprises a capacitance values storage circuit (D) 115 for storing capacitor values (e.g., capacitances D described below in conjunction with FIGS. 3, 5 and 6) measured for the VCO 108 during a calibration process performed at a plurality of frequencies, (e.g., two frequencies at or near opposite ends of a frequency range), as described below in conjunction with FIGS. 4-6. In one embodiment, the nominal capacitor values correspond to the capacitances at selected frequencies for a nominal phase lock loop, such as at typical process values. In one embodiment, the typical values correspond to PMOS and NMOS transistors and capacitors.

The VCO 108 generates an output frequency signal 134, which also is applied to the fractional divider 110. The fractional divider 110 generates the divided frequency signal 124 in response to the output frequency signal 134. The divided frequency signal 124 has a frequency that is a fraction of the frequency of the output frequency signal 134.

The phase lock loop 100 may be used, for example, in a wide band or multi-band frequency synthesizer. In one embodiment, the phase lock loop 100 may be used in an IEEE 802.11abg or 802.11h standard wireless communication system.

Figure 2:
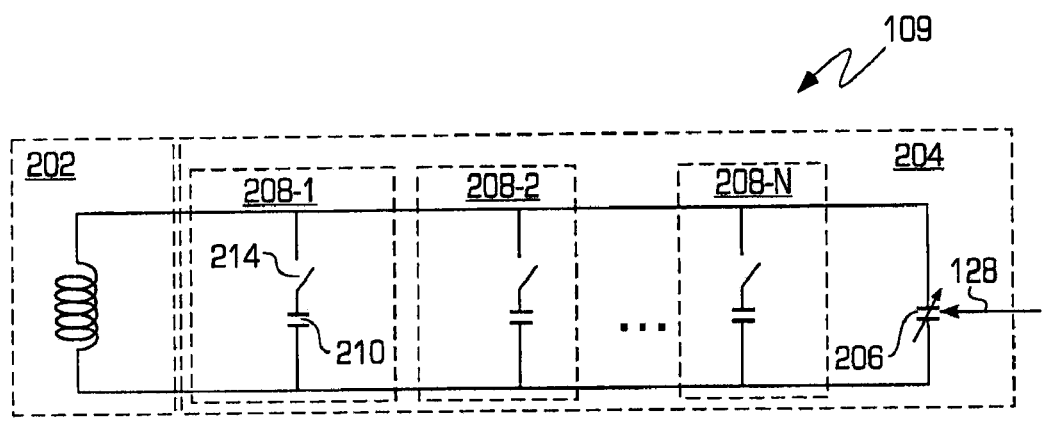
FIG. 2 is a schematic diagram of a tank circuit of a voltage controlled oscillator of the phase lock loop of FIG. 1.

FIG. 2 is a schematic diagram of the tank circuit 109. The tank circuit 109 comprises an inductor 202 and an adjustable capacitor 204. The inductor 202 and the adjustable capacitor 204 are coupled in parallel to form an adjustable LC circuit. The calibration circuit 112 provides the capacitor control signal 130 to the tank circuit 109 to selectively adjust the capacitance of the adjustable capacitor 204.

The phase lock loop 100 operates at a VCO frequency $f_{vco}$. The frequency $f_{vco}$ of the frequency signal 134 of the phase lock loop 100 is determined as:

$$f_{VCO} = \frac{1}{2\Pi\sqrt{LC}}$$

where the term L is the inductance of the inductor 202, and the term C is the capacitance of the adjustable capacitor 204.

The adjustable capacitor 204 comprises a variable capacitor 206 and a plurality of selectable capacitor circuits 208-1 through 208-N. Although three selectable capacitor circuits 208 are shown, the adjustable capacitor 204 may include any number of selectable capacitor circuits 208 based on the desired granularity of adjustable capacitance and/or frequency. The number of selectable capacitor circuits 208 and the capacitance of the capacitors 206 and 210 may be selected based on the desired frequency range of operation of the phase lock loop, the process variation of the phase lock loop 100, and temperature and voltage variation of operation of the phase lock loop 100. The variable capacitor 206 and the plurality of selectable capacitors 208 are coupled in parallel. Each selectable capacitor circuit 208 comprises a capacitor 210 and a switch 214 coupled in series. (For the sake of simplicity, reference numbers for the capacitor 210 and the switch 214 are shown only for one selectable capacitor circuit 208-1.) Any of the capacitors 210 may be formed of a single capacitor, or a plurality of capacitors coupled in series and/or in parallel. The variable capacitor 206 adjusts the tuning range of the VCO 108 in response to the VCO control voltage 128. The capacitance of the variable capacitor 206 is adjusted automatically by the phase lock loop 100. When the loop is locked, the VCO control voltage 128 sets the capacitance of the variable capacitor 206 so that divided frequency 124 matches the reference frequency signal 122. The selectable capacitors 208 are enabled to change the operating frequency of the phase lock loop 100 across different bands, for example, for frequency hopping or fast switching applications. The enabled capacitors 208 fine tune to the variable capacitor 206 so that the VCO frequency is continuous. The capacitance of the selectable capacitor circuits 208 as a parallel capacitor is controlled by selectively closing or opening the switches 214 in response to the capacitor control signal 130. In one embodiment, the control voltage 128 for controlling the variable capacitor 206 is controlled to be approximately one-half of the supply voltage by selecting the capacitance of the selectable capacitor circuit 204. In one embodiment, the selection of the capacitance is of the variable capacitor 206 and the capacitor 210 is determined based on the switching times for frequency switching of the VCO 108. In an illustrative example, the capacitors 210 may be tuned for 50 MHz changes in frequency.

The capacitance of the capacitors 210 in the selectable capacitor circuits 208-1 through 208-N may be different. In one embodiment, the capacitors 210 are fixed capacitors. The total number N of selectable capacitor circuits 208 is fixed. However, the number of switches 214 that are OPEN or CLOSED varies. For example, 30 switches 214 are closed for a 4 Gigahertz system, and 10 switches 214 are closed for a 5 Gigahertz system. The capacitance of the variable capacitor 206 may be adjusted to provide a desirable frequency of the tank circuit 109.

An overview of the operation of the phase lock loop 100 is described. Because of process variations, the capacitance of the capacitors 206 and 210 change. In one embodiment, the change of capacitance is proportional to its value. In other words, dC/C is a constant for a certain process corner, where C is the capacitance of the adjustable capacitor 204. Thus, if the capacitance C is known, the variation dC may be derived. The capacitance for operating properly at each of the plurality of frequencies at a typical or nominal corner may be determined and stored in the capacitor values table 113. In one embodiment, the nominal corners are measured in a laboratory or manufacturing facility. In another embodiment, the capacitance is determined analytically.

For each physical semiconductor circuit that contains the phase lock loop system, the calibration is performed at two frequencies, for example at or near opposite ends of the operating frequency range, at startup or after an idle time, and the difference capacitance dC is measured at the two frequencies. The dC values are stored in the capacitance values storage circuit 115. During operation, when the frequency of the phase lock loop 100 is changed, the difference capacitance dC at the selected frequency is derived using interpolation or extrapolation from the capacitance C value at the nominal corner stored in the capacitor values table 113.

Figure 3:
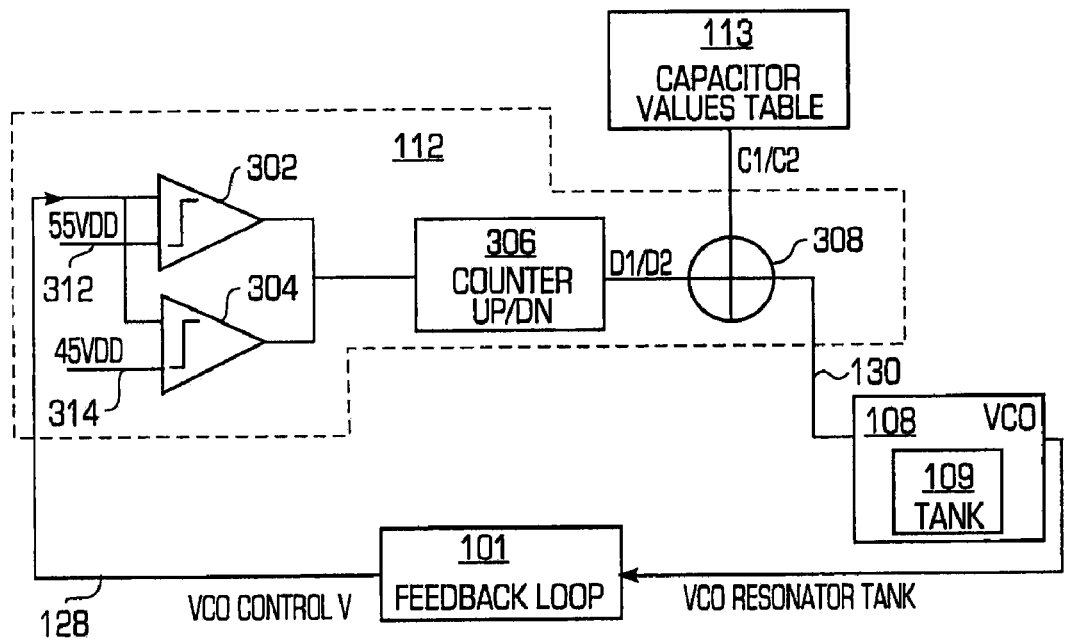
FIG. 3 is a block diagram illustrating a calibration circuit of the phase lock loop of FIG. 1.

FIG. 3 is a block diagram illustrating the calibration circuit 112. The calibration circuit 112 comprises a plurality of quantizers 302 and 304, an up/down counter 306, an adder 308, and the capacitor values table 113. The VCO 108 comprises the tank circuit 109 and a synthesizer 310. The calibration circuit 112 sets the capacitance of the tank circuit 109 by selectively enabling or disabling the switches 214 of the selectable capacitor circuits 208 in response to the output of the adder 308, which adds the control bits from the capacitor values table 113 to the output of the up/down counter 306. The outputs D1 and D2 of the up/down counter 306 represent the difference values of the capacitance of the tank circuit 109 at the two frequencies of the calibration. After calibration, the output values D1 and D2 are stored in the capacitance values storage circuit 115. The tank circuit 109 and the synthesizer 310 generate a VCO control voltage which is applied to the quantizers 302 and 304. The quantizer 302 generates a "1" output in response to the VCO control voltage being above a voltage applied on a reference terminal 312 of the quantizer 302. Otherwise, the quantizer 304 provides an output "0". In an illustrative example, a reference voltage of 1.1 volts (e.g., 0.55* supply voltage Vdd) is applied to the reference terminal 312. The quantizer 304 provides an output "1" in response to the VCO control voltage being above a voltage on a reference voltage terminal 314 of the quantizer 304. Otherwise, the quantizer 304 provides an output "0". In an illustrative embodiment, a reference voltage shows 0.9 volts (e.g., 0.45* the supply voltage Vdd) is applied to the reference voltage terminal 314. When the voltages on the inputs of the quantizers 302 and 304 are above the reference voltages on the reference terminals 312 and 314, respectively, the outputs of the quantizers 302 and 304 cause the up/down counter 306 to count up. When the voltages on the inputs of the quantizers 302 and 304 are below the reference voltage on the reference terminals 312 and 314, respectively, the outputs of the quantizers 302 and 304 cause the up/down counter 306 to count down. The quantizers 302 and 304 control the up/down counter 306 so the selected capacitance of the adjustable capacitor 204 of the LC tank 109 maintains the VCO control voltage between the voltages on the reference voltage terminals 312 and 314. An illustrative example, the VCO control voltage is controlled to fall between 0.9 volts and 1.1 volts. In one embodiment, the calibration circuit 112 provides a timeout if the VCO voltage is unstable. In one embodiment, if a time out occurs, the calibration circuit 112 arbitrarily selects the present capacitance value for D1 or D2.

Figure 4:
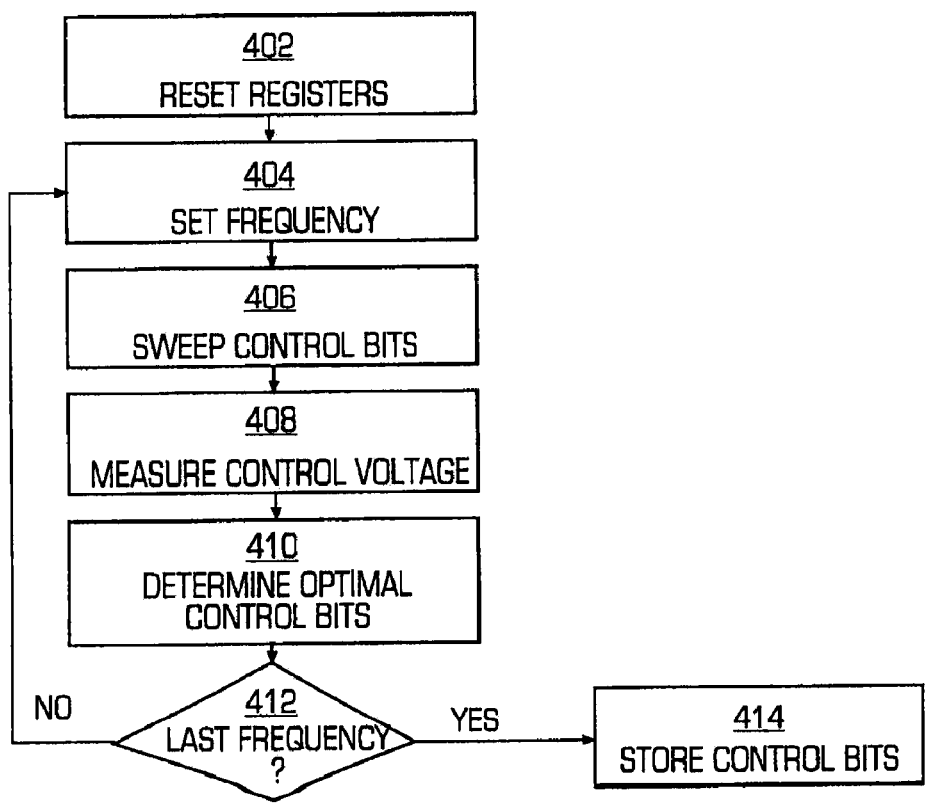
FIG. 4 is a flow chart illustrating the methodology of an initial calibration of a capacitor values table of FIG. 3.

FIG. 4 is a flow chart illustrating the methodology of an initial calibration of the calibration circuit 112. During the initial calibration, a calibration circuit 112 determines the nominal settings of the capacitors that are stored in the table 113. The calibration may be performed on a plurality of phase lock loops, such as a production sample, or may be done analytically. The calibration circuit 112 resets the registers to initialize the registers (not shown) of the calibration circuit 112 (block 402). The calibration circuit 112 sets a frequency of operation of the VCO 108 (block 404) and sweeps the control bits of the capacitor control signal 130 for opening and closing the switches 214 in the tank circuit 109 to set the capacitance (block 406). For each setting of the control bits, the calibration circuit 112 measures the control voltage 128 of the phase lock loop 100 to determine whether it is within the range of voltages on the reference voltage terminals 312 and 314 (FIG. 3) (e.g., approximately equal to one-half of the supply voltage) (block 408) and determines the control bits that set the VCO 108 at the set frequency (block 410). In one embodiment, the control bits are the optimal control bits. The calibration circuit 112 repeats the setting of the frequency (block 404), the sweeping of the control bits (block 406), the measuring of the control voltage(block 408) and the determining the control bits (block 410), until the control bits for the last frequency is determined (block 412). The calibration circuit 112 stores the control bits in the capacitor values table 113 (block 414).

Figure 5:
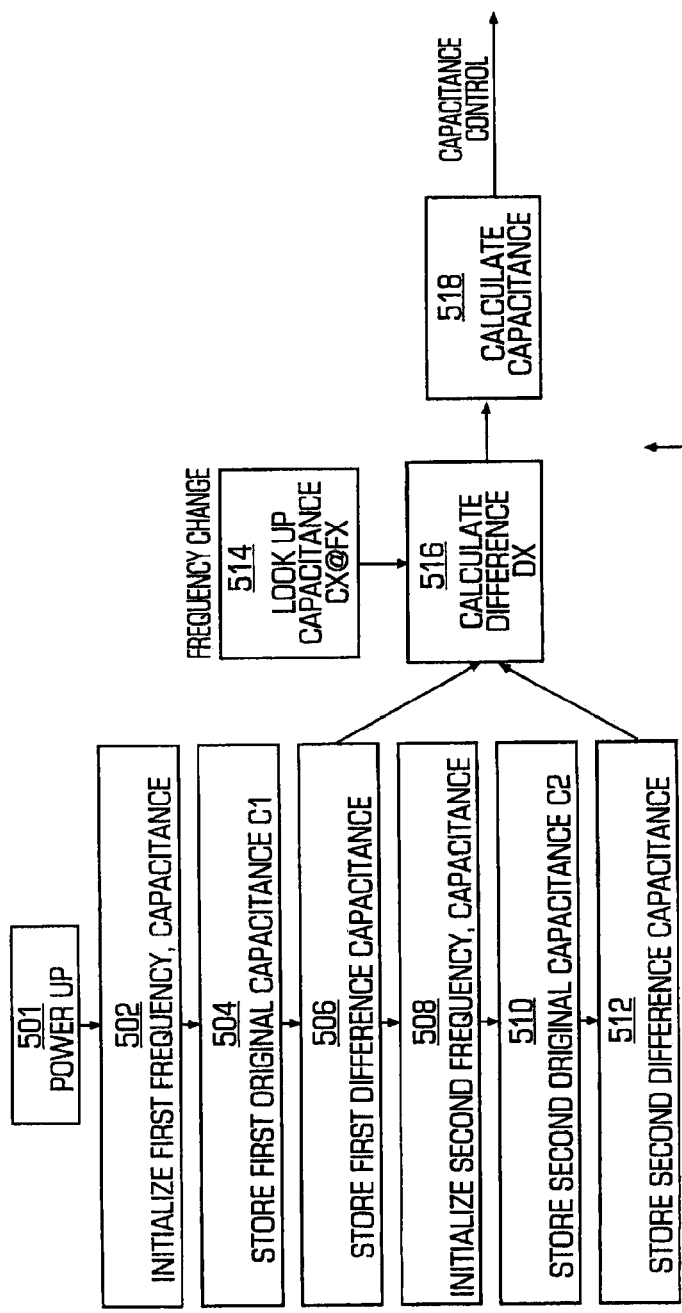
FIG. 5 is a flow chart illustrating the methodology of a calibration of the calibration circuit of FIG. 3.

FIG. 5 is a flowchart illustrating the methodology of the calibration circuit 112. The calibration of the phase lock loop 100 performs a corner calibration at two frequencies, such as endpoints or near the endpoints of the operating frequency range of the phase lock loop 100, and determines a capacitance value of the tank circuit 109 at each calibrated frequency. In response to a frequency change of the VCO 108 during normal operation of the phase lock loop 100, the measured capacitances are used to interpolate a delta capacitance that is added to the nominal capacitance stored in the capacitor values table 113. The capacitance of the tank circuit 109 is set to the calculated capacitance.

At power up (block 501), the calibration circuit 112 performs a calibration of the phase lock loop 200 at two frequencies (e.g., $F_1$ and $F_2$). The calibration circuit 112 initializes the frequency value (e.g., $F=F_1$) for the first frequency and the capacitance value (e.g., $C=C_1$) of the adjustable capacitor 204 (block 502). In an illustrative example, the frequencies $F_1$ and $F_2$ are 5.1 and 5.8 MHz, respectively. In one embodiment, the capacitances C1 and C2 are calibrated at two frequencies F1 and F2. In one embodiment, the calibration of the two frequencies also is performed after a predetermined idle time of the phase lock loop 100. The calibration circuit 112 waits for the phase lock loop 100 to settle (e.g., a predetermined time T1) and stores the capacitance $C_1$ value for the tank circuit 109 in the capacitance values storage circuit 115 (block 504). The calibration circuit 112 calculates and stores the capacitance difference (e.g., $D_1=C_1'-C_1$) in the capacitance values storage circuit 115 for use in the interpolation shown in FIG. 6 (block 506).

The calibration circuit 112 initializes the frequency value (e.g., $F=F_2$) for the second frequency and the capacitance value (e.g., $C=C_2$) of the adjustable capacitor 204 (block 508). The calibration circuit 112 waits for the phase lock loop 100 to settle (e.g., a predetermined time T1) and stores the capacitance $C_2$ value for the tank circuit 109 in the capacitance values storage circuit 115 (block 510). The calibration circuit 112 calculates and stores the capacitance difference (e.g., $D_2=C_2'-C_2$) in capacitance values storage circuit 115 for use in the interpolation shown in FIG. 6 (block 512).

During a frequency change, the phase lock loop 100 retrieves the capacitance value ($C_x$) from the capacitor values table 113 for the selected frequency (e.g., $F_x$) (block 514). The calibration circuit 112 calculates the difference capacitance at the selected frequency $F_x$ using an interpolation of the stored difference capacitances $D_1$ and $D_2$ as described below in conjunction with FIG. 6 (block 516). The calibration circuit 112 determines the capacitance control signal 130 as the sum of the retrieved capacitance $C_x$ and the interpolated capacitance $D_x$ (block 518).

Figure 6:
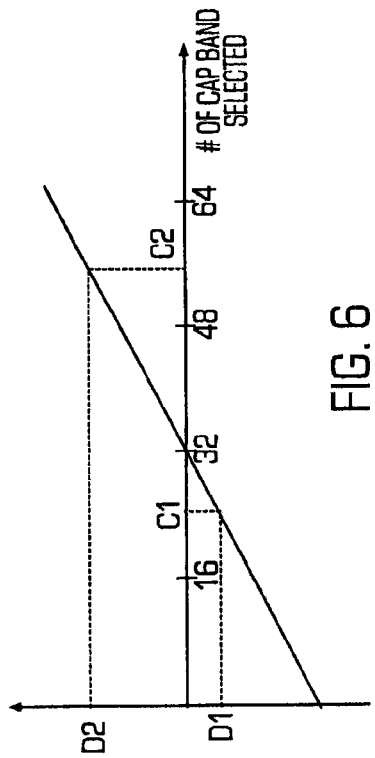
FIG. 6 is a graph illustrating an interpolation of the methodology of FIG. 5.

FIG. 6 is a graph illustrating the interpolation process of the methodology of FIG. 5. In one embodiment, with corner variation, the capacitor variation changes linearly with total capacitor band selected.

For a number N of capacitors in the frequency range, a capacitance Cx for a frequency $F_x$ maps to a compensation output Dx as follows:

$$Dx=(D2-D1)/N*(Cx-C1)+D1$$

In an illustrative embodiment, the difference in number of capacitors (N=C2−C1) is $$C2-C1=32$$

For thirty-two capacitors 210, the capacitance Cx maps to capacitance output $D_x$ as follows:

$$Dx=(D2-D1)/32*(Cx-C1)+D1$$

Although the process variation of capacitance is described as linear, non-linear capacitance relationships may be used.

In another embodiment, the phase lock loop may include multiple tank circuits or multiple inductors. The calibration schemes described herein may be used with appropriate modification.

The phase lock loop 100 provides a very short power up calibration time, uses a small chip area to store the capacitor settings C1 and C2 and the difference capacitor settings D1 and D2, and provides fast frequency switching times. Further, the phase lock loop 100 may switch between frequencies without running a calibration between frequency switches.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A method for calibrating a phase lock loop, the method comprising:
   receiving a capacitance profile of the phase lock loop for a frequency range and at a process corner;
   determining a first capacitance for the phase lock loop to operate at a first frequency;
   determining a second capacitance for the phase lock loop to operate at a second frequency;
   determining a first capacitance difference from the determined first capacitance to operate at the first frequency and a capacitance corresponding to the first frequency in the received capacitance profile;
   determining a second capacitance difference from the determined second capacitance to operate at the second frequency and a capacitance corresponding to the second frequency in the received capacitance profile;
   receiving a frequency selection signal for an operating frequency of the phase lock loop;
   calculating a difference capacitance corresponding to the operating frequency from the first and second capacitance differences; and
   determining a capacitance for operating the phase lock loop at the selected operating frequency in response to the capacitance corresponding to the received capacitance profile at the selected frequency and the calculated difference capacitance.

2. A method of claim 1 further comprising determining the capacitance profile of the phase lock loop from a plurality of phase lock loops on a plurality of semiconductor substrates.

3. The method of claim 1 wherein the determining the first and second capacitances occurs in response to a start up signal.

4. The method of claim 3 wherein the determining the first and second capacitances further occurs a predetermined idle time after receiving the frequency selection signal.

5. The method of claim 1 further comprising generating the capacitance profile of the phase lock loop.

6. The method of claim 5 wherein generating the capacitance profile includes determining a capacitance to set an operating frequency of the phase lock loop for each of a plurality of operating frequencies and at the process corner.

7. The method of claim 6 wherein the process corner is a typical process corner of a design of the phase lock loop.

8. The method of claim 5 wherein the generating the capacitance profile comprises:
   determining a capacitance for the phase lock loop for each of a plurality of frequencies in the frequency range at a second process corner, the second process corner being indicative of a plurality of phase lock loops.

9. The method of claim 1 wherein the determining the capacitance for operating the phase lock loop comprises:
   interpolating a difference capacitance at the operating frequency in response to the first and second capacitance differences: and
   adding the interpolated difference capacitance to a capacitance of the capacitance profile corresponding to the operating frequency.

10. A phase lock loop comprising:
    a phase frequency detector for generating a phase frequency signal in response to a reference frequency signal and a feedback frequency signal;
    a charge pump for generating a boosted voltage signal in response to the phase frequency signal;
    a loop filter for generating a filtered boosted voltage signal in response to the boosted voltage signal;
    a voltage controlled oscillator for generating an output frequency signal in response to the filtered boosted voltage signal;
    a tank circuit coupled to the voltage controlled oscillator for controlling frequency of the output frequency signal in response to a control signal;
    a divider circuit for generating the feedback frequency signal in response to the output frequency signal;
    a table for storing the capacitance profile of the phase lock loop,
    wherein the capacitance profile of the phase lock loop corresponds to a capacitance profile at a typical process corner of a design of the phase lock loop and determined under a first set of operating conditions,
    a storage circuit for storing capacitance values for first and second frequencies; and
    a calibration circuit for generating the control signal to set a capacitance of the tank circuit for controlling the frequency of the output frequency signal in response to the filtered boosted voltage signal and a frequency selection signal, the calibration circuit determines the capacitance values of the tank circuit for the phase lock loop to operate at the first and second frequencies in response to the frequency selection signal being indicative of the first and second frequencies, respectively, calculates a capacitance corresponding to an operating frequency in response to the determined capacitances for the first and second frequencies and a capacitance profile, in response to the frequency selection signal being indicative of the operating frequency, and generates the control signal to set the capacitance of the tank circuit at the calculated capacitance in response to the filtered boosted voltage signal and the frequency selection signal being indicative of the operating frequency, the capacitance profile being indicative of a predetermined capacitive profile of the phase lock loop for a frequency range and at a process corner, and wherein the calibration circuit determines the capacitance values of the tank circuit for the phase lock loop to operate at the first and second frequencies and calculates the capacitance corresponding to the operating frequency under a second set of operating conditions, the first and second sets of operating conditions being different.

11. The phase lock loop of claim 10 wherein the calibration circuit determines the capacitances for the phase lock loop to operate at the first and second frequencies in response to a start up signal.

12. The phase lock loop of claim 11 wherein the calibration circuit also determines the capacitances for the phase lock loop to operate at the first and second frequencies a predetermined idle time after receiving the frequency selection signal.

13. The phase lock loop of claim 10 wherein the tank circuit comprises an inductor and an adjustable capacitor, the adjustable capacitor having a capacitance that is selectable in response to the control signal.

14. The phase lock loop of claim 13 wherein the adjustable capacitor comprises a plurality of selectable capacitor circuits coupled to each other in parallel, each selectable capacitor circuit comprising a switch and a fixed capacitor coupled in series, the switch being enabled or disabled in response to the control signal.

15. A phase lock loop comprising:
   a phase frequency detector for generating a phase frequency signal in response to a reference frequency signal and a feedback frequency signal;
   a charge pump for generating a boosted voltage signal in response to the phase frequency signal;
   a loop filter for generating a filtered boosted voltage signal in response to the boosted voltage signal;
   a voltage controlled oscillator for generating an output frequency signal in response to the filtered boosted voltage signal;
   a tank circuit coupled to the voltage controlled oscillator for controlling frequency of the output frequency signal in response to a control signal;
   a divider circuit for generating the feedback frequency signal in response to the output frequency signal;
   a storage circuit for storing capacitance values for first and second frequencies; and
   a calibration circuit for generating the control signal to set a capacitance of the tank circuit for controlling the frequency of the output frequency signal in response to the filtered boosted voltage signal and a frequency selection signal, the calibration circuit determines the capacitance values of the tank circuit for the phase lock loop to operate at the first and second frequencies in response to the frequency selection signal being indicative of the first and second frequencies, respectively, calculates a capacitance corresponding to an operating frequency in response to the determined capacitances for the first and second frequencies and a capacitance profile of the phase lock loop for a frequency range and at a process corner, in response to the frequency selection signal being indicative of the operating frequency, and generates the control signal to set the capacitance of the tank circuit at the calculated capacitance in response to the filtered boosted voltage signal and the frequency selection signal being indicative of the operating frequency,
   wherein the capacitance profile of the phase lock loop corresponds to capacitance values of a plurality of phase lock loops on a plurality of semiconductor substrates.

16. A phase lock loop comprising:
   a phase frequency detector for generating a phase frequency signal in response to a reference frequency signal and a feedback frequency signal;
   a charge pump for generating a boosted voltage signal in response to the phase frequency signal;
   a loop filter for generating a filtered boosted voltage signal in response to the boosted voltage signal;
   a voltage controlled oscillator for generating an output frequency signal in response to the filtered boosted voltage signal;
   a tank circuit coupled to the voltage controlled oscillator for controlling frequency of the output frequency signal in response to a control signal;
   a divider circuit for generating the feedback frequency signal in response to the output frequency signal;
   a storage circuit for storing capacitance values for first and second frequencies; and
   a calibration circuit for generating the control signal to set a capacitance of the tank circuit for controlling the frequency of the output frequency signal in response to the filtered boosted voltage signal and a frequency selection signal, the calibration circuit determines the capacitance values of the tank circuit for the phase lock loop to operate at the first and second frequencies in response to the frequency selection signal being indicative of the first and second frequencies, respectively, calculates a capacitance corresponding to an operating frequency in response to the determined capacitances for the first and second frequencies and a capacitance profile of the phase lock loop for a frequency range and at a process corner, in response to the frequency selection signal being indicative of the operating frequency, and generates the control signal to set the capacitance of the tank circuit at the calculated capacitance in response to the filtered boosted voltage signal and the frequency selection signal being indicative of the operating frequency,
   wherein the calibration circuit calculates the capacitance corresponding to the operating frequency using an interpolation of the capacitances for the first and second frequencies and adding the interpolation to a capacitance of the capacitance profile corresponding to the operating frequency.

* * * * *